United States Patent [19]

Humphrey

[11] Patent Number: 4,721,470

[45] Date of Patent: Jan. 26, 1988

[54] KEYS FOR ELECTRICAL CONNECTORS

[75] Inventor: David T. Humphrey, Mechanicsburg, Pa.

[73] Assignee: E. I. Du Pont de Nemours and Company, Wilmington, Del.

[21] Appl. No.: 37,921

[22] Filed: Apr. 13, 1987

[51] Int. Cl.[4] .................................... H05K 1/00

[52] U.S. Cl. .................................... 439/55; 439/78; 439/573

[58] Field of Search .................... 439/55, 78, 527, 529, 439/554, 557, 658, 677, 680, 681, 542, 543, 573; 361/393, 413, 415

[56] References Cited

U.S. PATENT DOCUMENTS

| | | | |
|---|---|---|---|
| 2,659,872 | 11/1953 | Gilbert | 439/680 |
| 4,173,387 | 11/1979 | Zell | 439/557 |
| 4,363,530 | 12/1982 | Verhoeven | 439/557 |
| 4,519,667 | 5/1985 | Canning et al. | 439/681 |
| 4,568,134 | 2/1986 | Di Mondi | 439/680 |

*Primary Examiner*—Gil Weidenfeld
*Assistant Examiner*—David Pirlot

[57] ABSTRACT

A dual sided key is described for securing together electrical connectors. The key is comprised of a male and a female part with the male part having a breakaway guide stud so that when the parts of the key are sufficiently stressed, the guide stud breaks away leaving the connection complete.

4 Claims, 3 Drawing Figures

KEYS FOR ELECTRICAL CONNECTORS

BACKGROUND OF THE INVENTION

The invention relates to keys which not only secure electrical connectors to circuit boards, but also insure that only the proper connectors can be used together.

It is often necessary or desirable to mount electrical connectors, such as header and shroud connectors on opposite sides of a printed circuit board, typically referred to as a mother board. Various keys are known in the prior art for accomplishing this mounting arrangement by clamping the circuit board between the header and shroud. Such keys however, have been generally unsatisfactory inasmuch as they are often relatively expensive, will not permit simultaneous keying to both the header and shroud, are difficult to use and/or are not substantial enough to securely attach the header and shroud to the circuit board. It is particularly necessary that such keys be relatively strong so that they do not become crushed or disabled if a wrong connector is used.

A further requirement of the key for some applications is that it be capable of being engaged by a single person working from on one side of the circuit board only. Keys which require simultaneous access to both sides render it more difficult to work with circuit boards. Also such keys of the prior art have a unique, typically polygonal, cross-section for "coding" the keys to the different types of connectors to ensure that only the proper connectors can be coupled. Unfortunately if these prior art keys are used, the coding features often cannot be used on dual sided connector applications unless the connector is left uncoupled to the circuit board. Their use has been limited from a practical standpoint to single sided applications.

SUMMARY OF THE INVENTION

A dual sided key is provided according to this invention which solves many of the problems of prior art. The key of this invention is adapted to secure connectors (typically header and shroud) together on opposite sides of a printed circuit board, the key being adapted to fit in respective aligned polygonal recesses formed in the ends of each header and shroud, the key comprising:

an integral, elongated male part having a longitudinal axis and interconnected head shaft, and guide stud, all located on the axis, the head having a polygonal cross-section adapted to fit in one of the header and shroud recesses and a bore lying on the axis, the shaft having longitudinal grooves, the guide stud being tapered or necked to define a breakaway point where it joins the shaft, and a female part polygonal in cross-section adapted to fit in the other of the header and shroud recesses, the female part having a bore, sized to receive the shaft with an interference fit, and a counter bore to provide access to the bore.

It is preferable that the guide stud has a diameter less than the diameter of the bore in the female part. Furthermore it is preferable that the header and female part are octagonal in the cross-section to prevent their rotation within the respective header and shroud. The male part is constructed such that the stud has a weakened connection to the grooved shaft such that under the tension of securing the female and male parts together from opposite sides of the circuit board, the guide stud breaks off leaving the shroud and header tightly held together.

DESCRIPTION OF THE DRAWINGS

The invention will be better understood when considered in connection with the accompanying drawings in which.

DESCRIPTION OF THE PREFERRED EMBODIMENT

Figure 1:
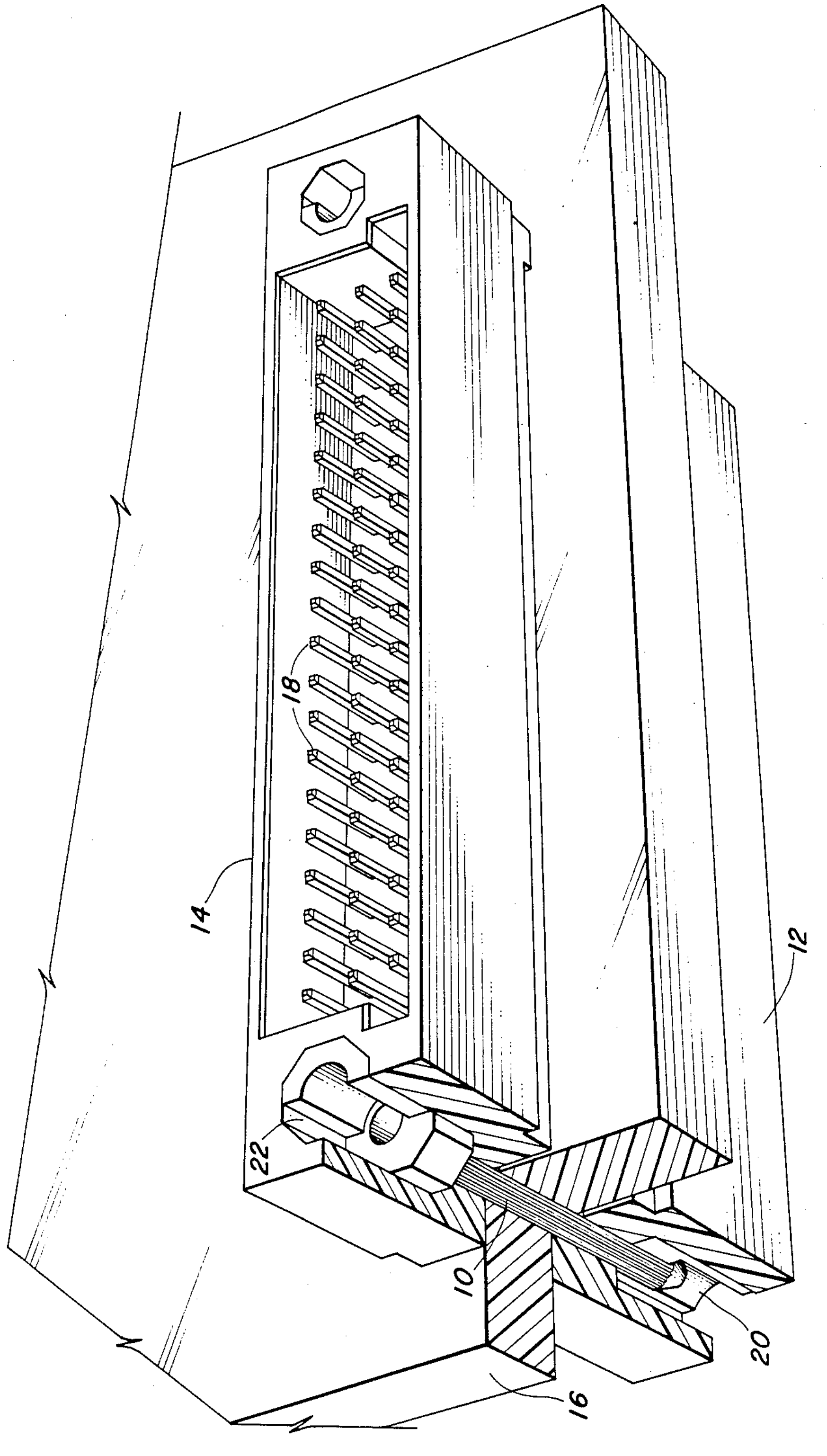
FIG. 1 is a pictorial view partially cut away of the dual sided key, constructed in accordance with this invention, in position to hold a shroud and header tightly on opposite sides of a circuit board.

There may be seen in FIG. 1 a dual sided key 10, constructed according to this invention, in a position holding a header 12 and shroud 14 tightly on opposite sides of a circuit board such as mother board 16. The shroud 14 has rows of compliant pins 18 adapted to be press fit into an appropriate receptacle. These pins 18, as is known, extend through the shroud 14 and corresponding apertures (not shown) in both the circuit board 16 and the header 12. Both ends of the dual sided key 10 are polygonal, preferably octagonal, in cross-section and fit into corresponding polygonal (octagonal) recesses 20 and 22 in the respective header 12 and shroud 14.

Figure 2:
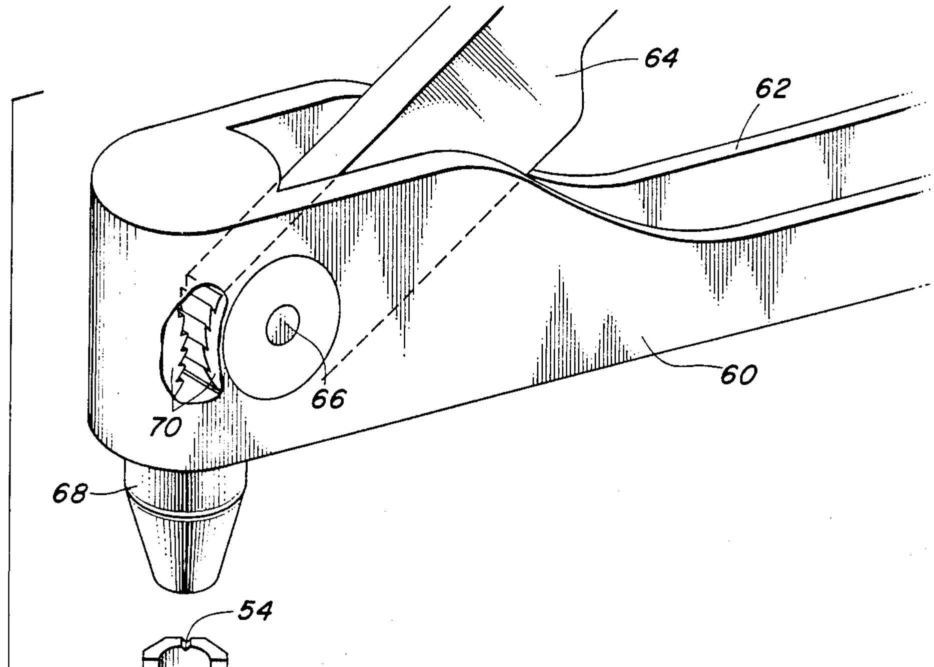
FIG. 2 is an exploded view illustrating the manner in which the male and female parts of the key of FIG. 1 are positioned to be tightened using an appropriate insertion tool.
Figure 2:
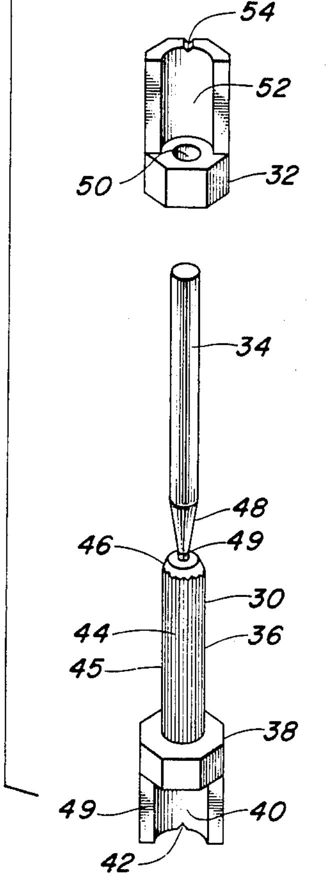
Figure 3:
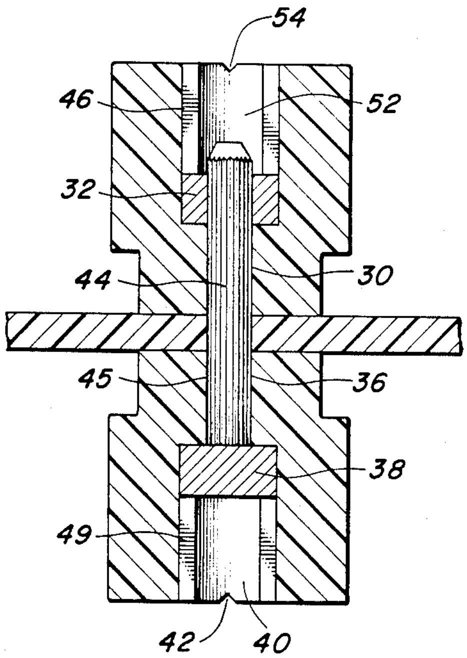
FIG. 3 is a fragmentary detail drawing in side elevation depicting features of the dual sided key of FIG. 2.

The details of the dual sided key 10 are best seen in the exploded view of FIG. 2. The key 10 is seen to include a male part 30 and a female part 32. The male part 30 includes a guide stud 34, a grooved shaft 36, and a head 38 longitudinally and integrally formed of a suitable, preferably metallic, material having the desired tensile strength and low stress relaxation, such as stainless steel. The head 38 is polygonal (preferably octagonal) in shape in cross-section having at its end a bore 40 formed on the axis of the part 30. Th head 38 is cut away as at 49 along the axis of the part 30 so that half of the bore 40 is open at the outer portion of the male part.

The grooved shaft 36 has longitudinal grooves 44 which define longitudinal ridges 45 and its upper part (in the drawing) is formed with a bevel 46 to facilitate its passage into a corresponding bore 50 in the female part 32. The guide stud 34 is joined to th grooved shaft 36 through a portion 48 of reduced diameter, i.e., it may be tapered, to provide a breakaway point 49 adjacent the shaft 36 such that during installation, as the required tensile strength is built up between the male and female parts, the guide stud will break away to permit its removal. Alternatively, the shaft 36 may be knurled in any desired manner to facilitate its retention in the bore 50.

The female part is similarly constructed to have a polygonal (preferably octagonal) cross-section with a central bore 50 and a counter bore 52 both adapted (when assembled) to lie on the axis of the male part 30. Grooves 42 and 54 may be formed in the end faces of the male and female parts 30 and 32, respectively, to facilitate orientation of the key.

An insertion tool 60, similar to those used with Pop Rivots TM, may be used to facilitate the use of a dual sided key. The insertion tool 60 includes a U-shaped handle 62 which accommodates an actuating arm 64 pivotally mounted as at 66 within one end of the U-shaped handle 62. A chuck housing 68 extends downwardly (in the drawing) from the tool 60 to engage the guide studs 34. A toothed chuck 70 inside the end portion of the tool 60 is operated by the actuating arm 64 to grip the guide stud 34 extending through the bore 50 and, upon squeezing the actuating arm and handle 62 together, draws the guide stud 34 up into the tool until the guide stud breaks away at the point 49.

In operation, a header 12 and shroud 14 are positioned on opposite sides of the circuit board 16. The female part 32 of the key is positioned in one recess 20 and the male part 30 is positioned, with its head 38 in the bottom of one of the recesses 22, with the guide stud 34 extending through an aperture in the circuit board 16 and the bore 50 of the female part. The tool 60 is positioned with the chuck housing 68 over the guide stud 34. When the tool is actuated, the guide stud is pulled up into the tool. This causes the grooved shaft 36 to tightly engage the bore 50 with an interference fit (the ridges formed by the grooves deforming) and head 38 to compress the shroud 14, header 12, and board 16 together. As the pressure continues, a point will be reached wherein the breakaway point 49 permits the guide stud 34 to breadaway from the remainder of the key. The operation now is complete with the shroud and header tightly secured to either side of the mother board 16.

The key thus described is seen to be a mechanically strong fastener. Even if a wrong receptacle is attempted to be pressed into the shroud or header, no damage is done to the mounting. The key is operated and installed from a single side of the board only and the mounting may be accomplished by a single person acting from this one side of the board. In addition the key is of relatively simple construction and can be constructed at a relatively low cost.

What is claimed is:

1. A dual sided key adapted to secure header and shroud connectors together on opposite sides of a printed circuit board, the key adapted to fit in respective aligned polygonal recesses formed in each header and shroud, the key comprising:

an integral elongated male part having a longitudinal axis, an interconnected head, shaft, and guide stud, all located on the axis, the head having a polygonal cross-section adapted to fit in one of the header and shroud recesses and a bore lying on the axis, the shaft being knurled, the guide stud having a portion of reduced diameter to define a breakaway point where it joins the shaft, and a female part polygonal in cross-section adapted to fit in the other of the header and shroud recesses, the female part having a bore, sized to receive the shaft with an interference fit.

2. A dual sided key of claim 1 wherein the head and female part are octagonal in cross-section.

3. A dual sided key of claim 1 wherein the guide stud has a diameter less than the diameter of the bore in the female part.

4. A dual sided key of claim 3 wherein the head and female part are octagonal in cross-section.

* * * * *